United States Patent [19]

Baliga

[11] Patent Number: 5,459,089

[45] Date of Patent: Oct. 17, 1995

[54] METHOD OF FABRICATING HIGH VOLTAGE SILICON CARBIDE MESFETS

[75] Inventor: Bantval J. Baliga, Raleigh, N.C.

[73] Assignee: North Carolina State University, Raleigh, N.C.

[21] Appl. No.: 355,034

[22] Filed: Dec. 13, 1994

Related U.S. Application Data

[62] Division of Ser. No. 237,787, May 4, 1994, Pat. No. 5,399,883.

[51] Int. Cl.$^6$ .................................................. H01L 21/8232
[52] U.S. Cl. ........................... 437/40; 437/22; 437/24; 437/100; 437/912
[58] Field of Search ........................... 437/40, 22, 24, 437/913, 100; 148/DIG. 148

[56] References Cited

U.S. PATENT DOCUMENTS

| | | | |
|---|---|---|---|
| 5,170,231 | 12/1992 | Fujii et al. | 437/100 |
| 5,270,244 | 12/1993 | Baliga | 437/67 |
| 5,318,915 | 6/1994 | Baliga et al. | 437/24 |
| 5,322,802 | 1/1994 | Baliga et al. | 437/22 |
| 5,378,642 | 1/1995 | Brown et al. | 437/100 |
| 5,397,717 | 3/1995 | Davis et al. | 437/100 |

OTHER PUBLICATIONS

*Silicon Carbide Microwave FETs*, Palmour et al., Dec. 1993 International Conference on Silicon Carbide and Related Materials, Abstract We A6.
*SiC Microwave Power MESFETs*, Siram et al., Dec. 1993 International Conference on Silicon Carbide Materials, Abtract We A7.
*High Voltage Thin Layer Devices (Resurf Devices)*, Appels et al., IEDM 1979, pp. 238–241, Dec. 1979.
*Low Contact Resistivity Ohmic Contacts to 6H–Silicon Carbide*, Alok et al., IEDM Technical Digest, pp. 691–694, Dec. 1993.

*Primary Examiner*—Tom Thomas
*Assistant Examiner*—Michael Trinh
*Attorney, Agent, or Firm*—Bell, Seltzer, Park & Gibson

[57] ABSTRACT

A high voltage silicon carbide MESFET includes an electric field equalizing region in a monocrystalline silicon carbide substrate at a face thereof, which extends between the drain and gate of the MESFET and between the source and gate of the MESFET. The region equalizes the electric field between the drain and gate and between the source and gate to thereby increase the breakdown voltage of the silicon carbide MESFET. The first and second electric field equalizing regions are preferably amorphous silicon carbide regions in the monocrystalline silicon carbide substrate. The amorphous regions are preferably formed by performing a shallow ion implantation of electrically inactive ions such as argon, using the source and drain electrodes and the metal gate as a mask, at a sufficient dose and energy to amorphize the substrate face. A third amorphous silicon carbide region may be formed at the face, adjacent and surrounding the MESFET to provide edge termination and isolation of the MESFET. The third amorphous, silicon carbide region may be formed during the same shallow implant described above or may be formed in a separate deep implant. The lateral silicon carbide MESFET may be formed in an epitaxial region of second conductivity type on a substrate of first conductivity type, or in an implanted region of second conductivity type in a substrate of first conductivity type.

26 Claims, 5 Drawing Sheets

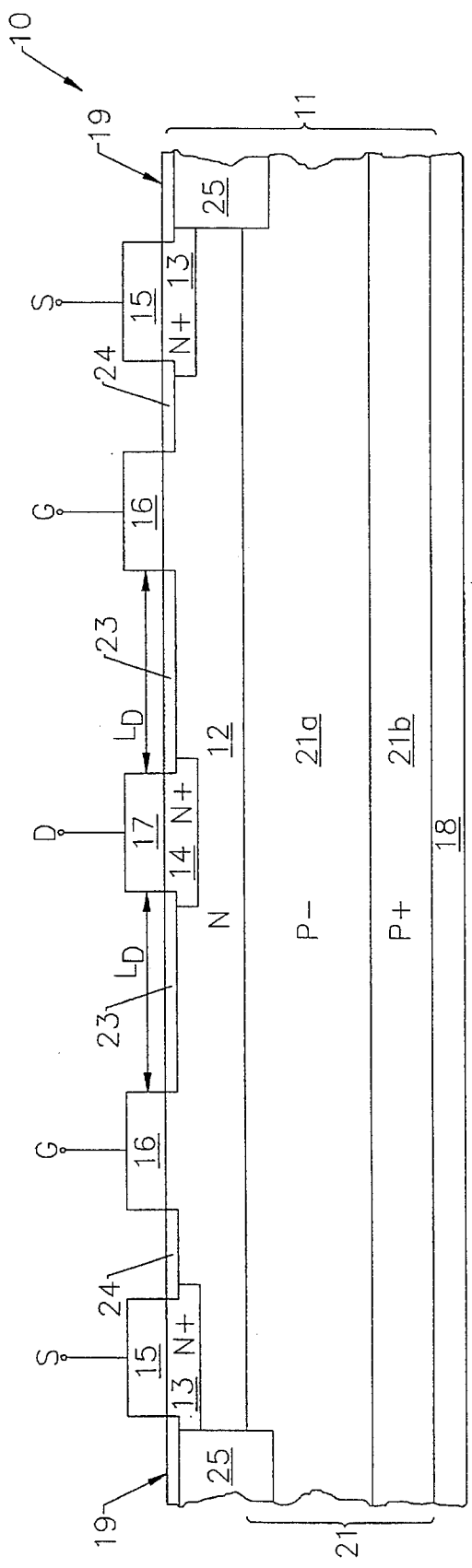
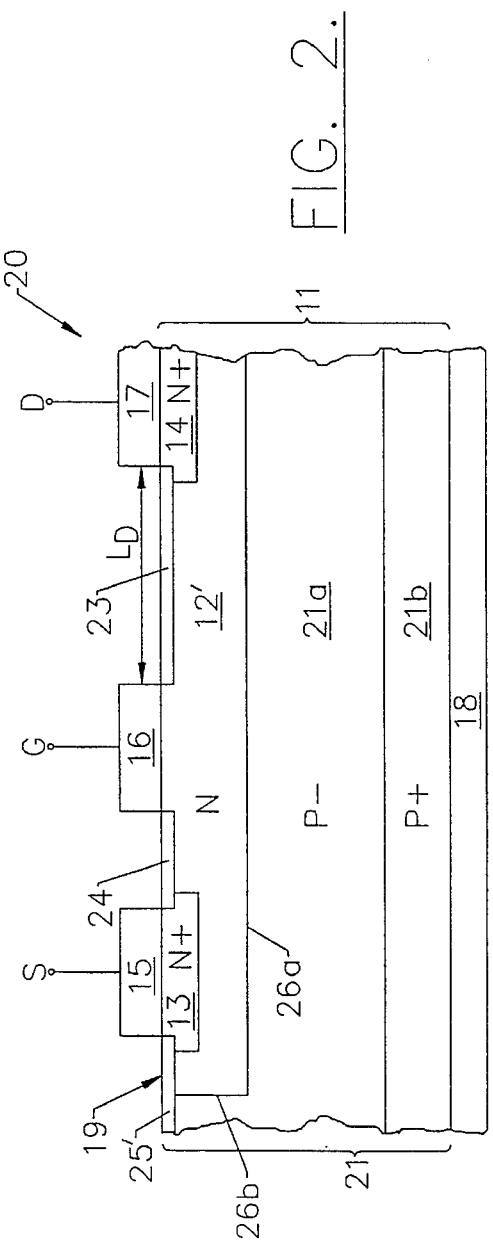
FIG. 1.
FIG. 2.

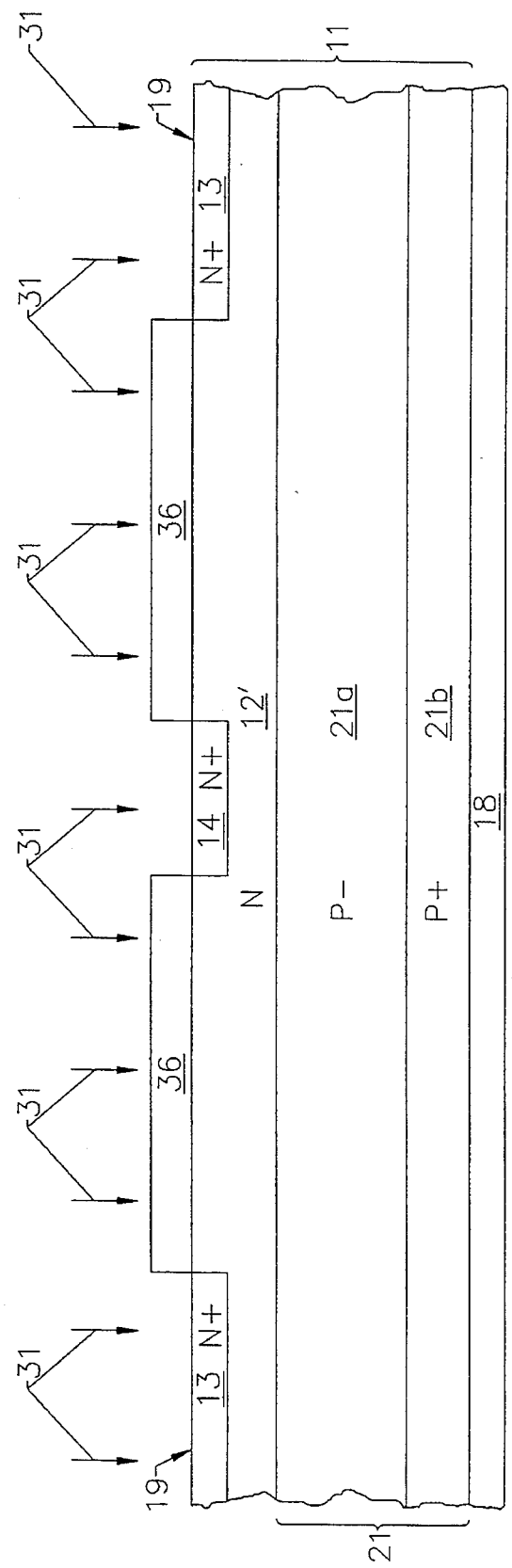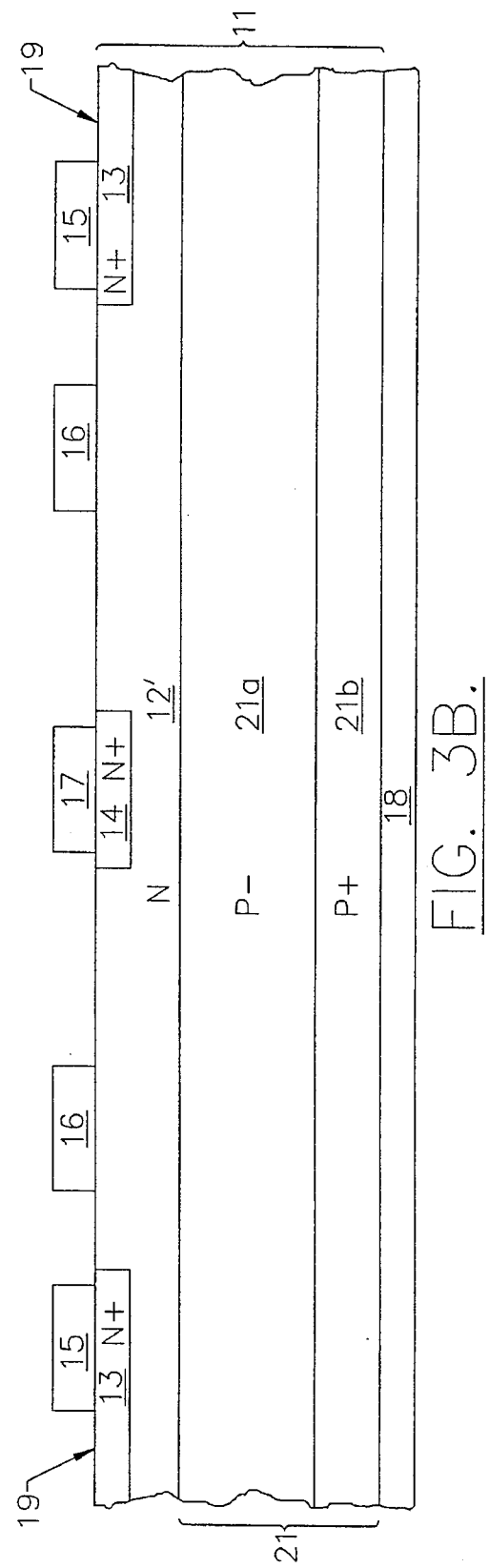

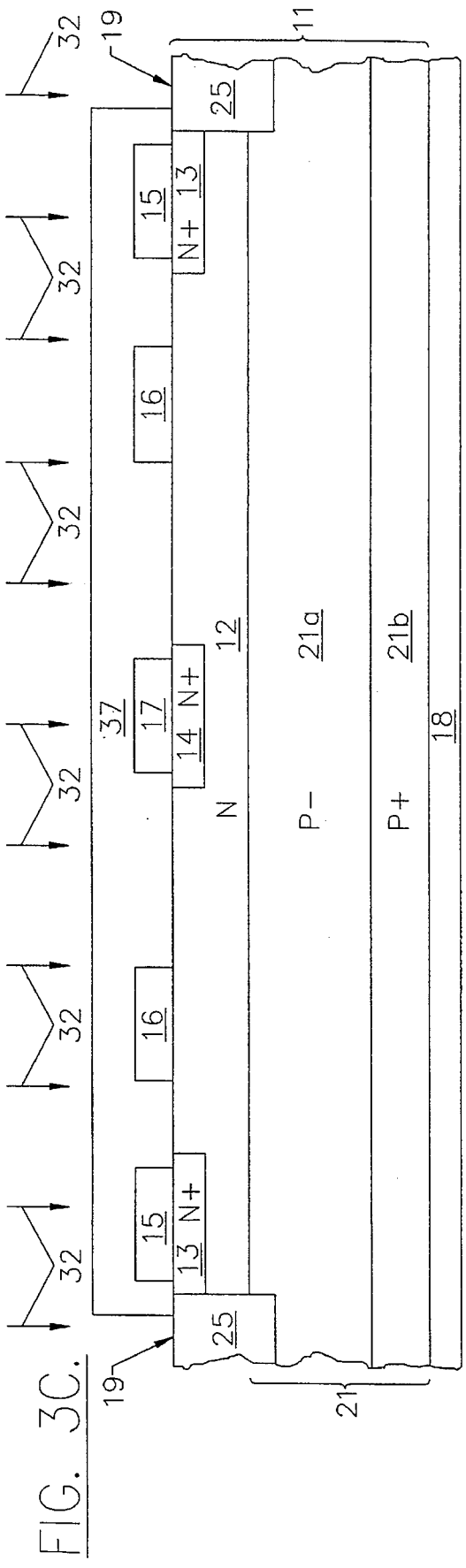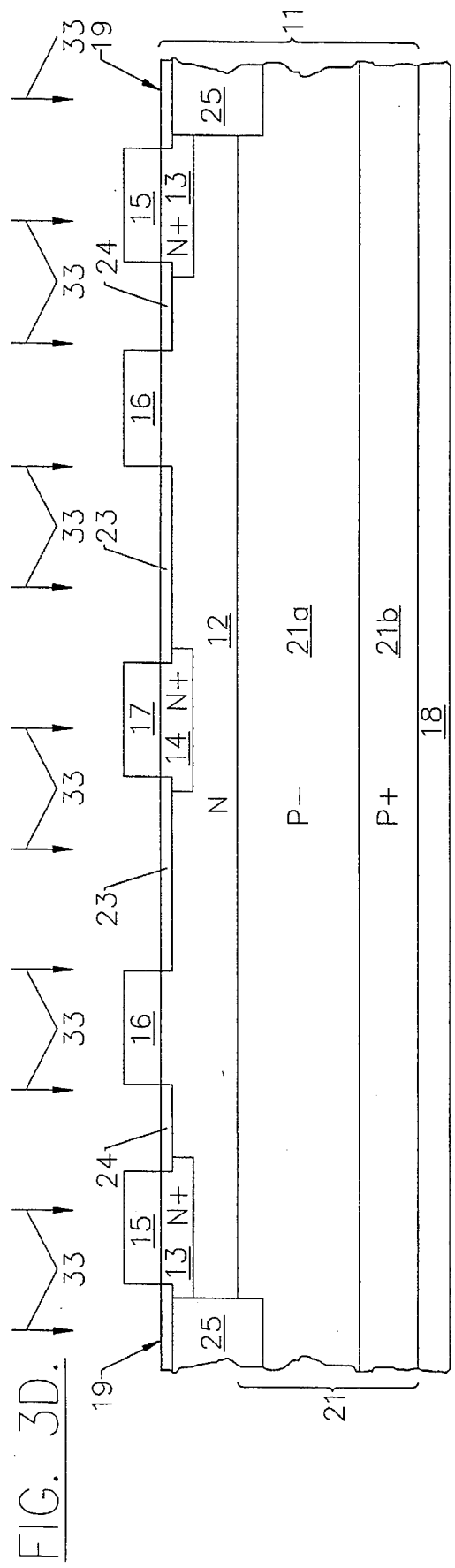

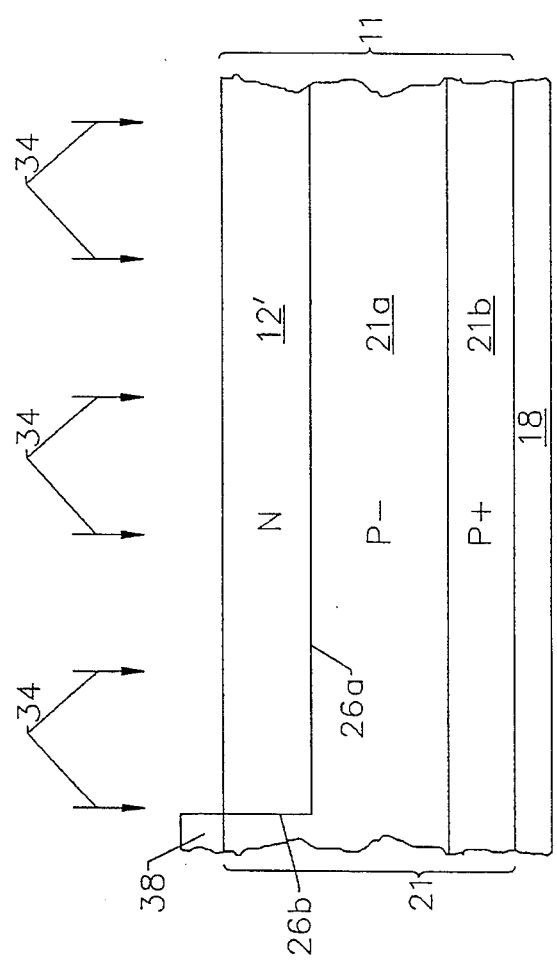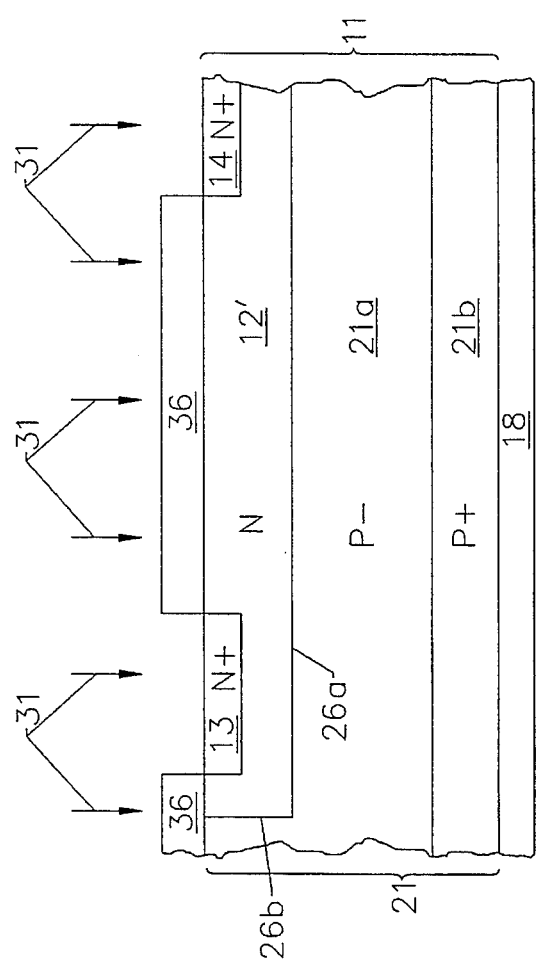

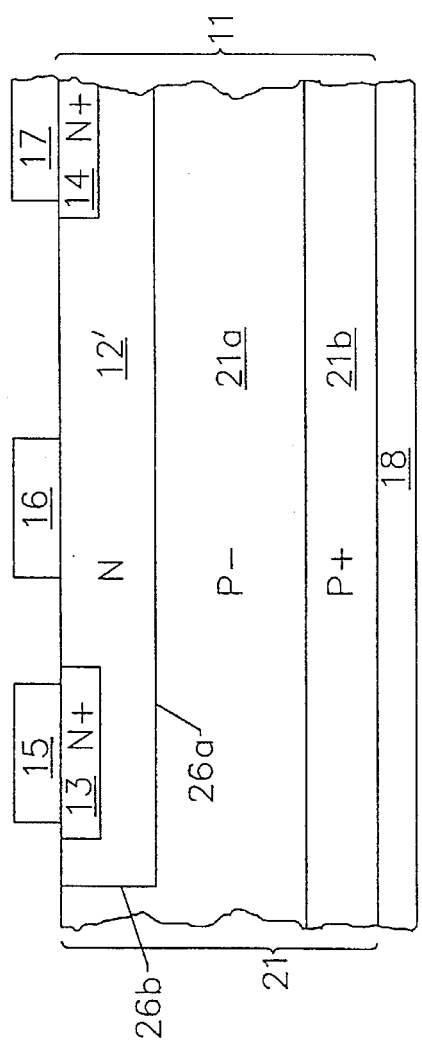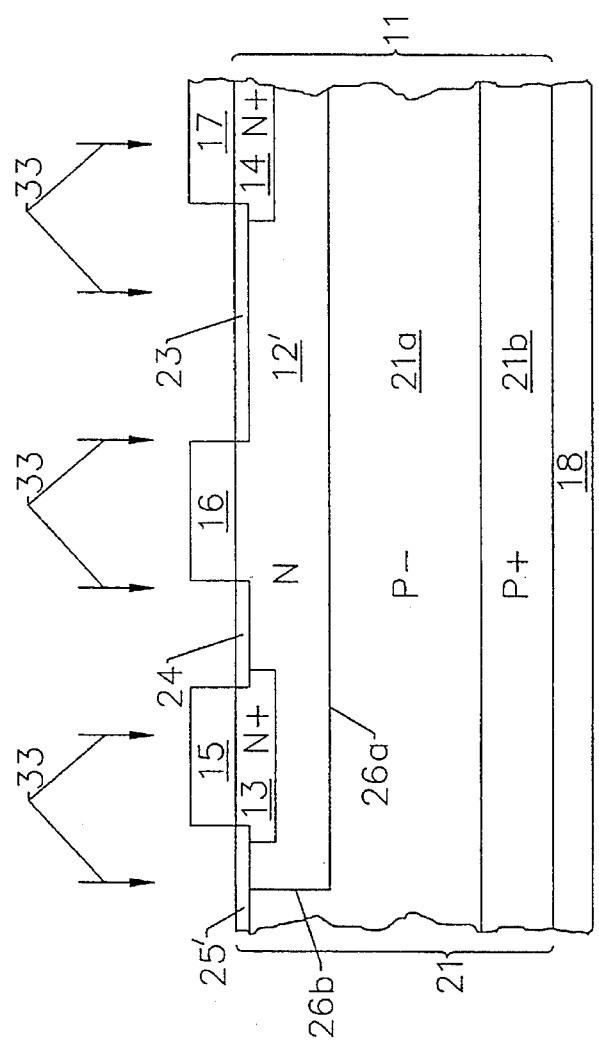

METHOD OF FABRICATING HIGH VOLTAGE SILICON CARBIDE MESFETS

This application is a divisional of application Ser. No. 08/237,787, filed May 4, 1994, now U.S. Pat. No. 5,399,883.

FIELD OF THE INVENTION

This invention relates to silicon carbide semiconductor devices and more particularly to silicon carbide power semiconductor devices.

BACKGROUND O THE INVENTION

Power devices are widely used to carry large currents and support high voltages. Since the early 1950's, developers of electronic power systems began to base their power systems on semiconductor devices.

The power bipolar transistor was first developed in the early 1950's and its technology has matured to a high degree. However, despite the attractive power ratings achieved for bipolar transistors, there are several fundamental drawbacks in their operating characteristics. First, since the bipolar transistor is a current controlled device, large base currents are required to maintain the transistor in the on state. Even larger reverse base drive currents are necessary to obtain high speed turnoff. Bipolar transistors are also vulnerable to a second breakdown failure mode under the simultaneous application of high current and high voltage to the device. It is also difficult to parallel bipolar power devices.

The power Field Effect Transistor (FET) was developed to solve the performance limitations of power bipolar transistors. Power FETs are typically variants of the Insulated Gate FET (IGFET), the Metal Insulator Semiconductor FET (MISFET) also commonly referred to as Metal Oxide Semiconductor FET (MOSFET), or the MEtal Semiconductor FET (MESFET). Power Junction FET's (JFET) may also be provided.

In power FET operation, a control signal is applied to the gate electrode which is essentially a bias voltage. No significant steady state current flows during either the off state or on state. Thus, gate drive circuitry is simplified and the cost of the power electronics is reduced. Moreover, because current conduction in the FET occurs through majority carrier transport only, no delays are observed as a result of storage or recombination of minority carriers during turn-off. Thus, FET switching speeds may be orders of magnitude faster than those of bipolar transistors. Power FETs also possess an excellent safe operating area. That is, they can withstand the simultaneous application of high current and voltage for a short duration without undergoing destructive failure due to second breakdown. Power FETs can also be easily paralleled because the forward voltage drop of power FETs increases with increasing temperature.

In view of the above desirable characteristics, many variations of power FETs have been designed. For example, lateral MESFETs have been developed in gallium arsenide technology for microwave applications. These devices have used a recessed gate structure to obtain channel pinchoff and low source resistance. Unfortunately, the breakdown voltage of these devices is less than 100 V.

Monocrystalline silicon carbide has also been widely investigated for power semiconductor devices. As is known to those having skill in the art, monocrystalline silicon carbide is particularly well suited for use in semiconductor devices, and in particular for power semiconductor devices. Silicon carbide has a wide bandgap, a high melting point, a low dielectric constant, a high breakdown field strength, a high thermal conductivity and a high saturation electron drift velocity compared to silicon. These characteristics would allow silicon carbide power devices to operate at higher temperatures, high power levels and with lower specific on-resistance than conventional silicon based power devices. Recessed gate lateral MESFETs have been reported in silicon carbide. See for example articles entitled *Silicon Carbide Microwave FETs* by Palmour et al., 1993 International Conference on Silicon Carbide and Related Materials, Abstract We A6; and *SIC Microwave Power MESFETs* by Siram et al., 1993 International Conference on Silicon Carbide and Related Materials, Abstract We A7. Unfortunately, these devices have breakdown voltages of less than about 100 V.

SUMMARY OF THE INVENTION

It is therefore an object of the present invention to provide improved silicon carbide MESFET power devices and methods for fabricating same.

It is another object of the present invention to provide silicon carbide MESFET power devices which are resistant to voltage breakdown, and methods of fabricating same.

These and other objects are provided, according to the present invention by a silicon carbide MESFET which includes an electric field equalizing region in a monocrystalline silicon carbide substrate, at a face thereof, which extends between the drain and gate of the MESFET and which equalizes the electric field between the drain and gate to thereby increase the drain breakdown voltage of the silicon carbide MESFET. Preferably, a second electric field equalizing region in the monocrystalline silicon carbide substrate, at the face, extends between the source and gate to equalize the electric field between the source and gate and thereby increase the gate breakdown voltage of the silicon carbide MESFET. The field equalizing regions can also be used in other field effect transistors such as MOSFETs and JFETs.

The first and second electric field equalizing regions are preferably amorphous silicon carbide regions in the monocrystalline silicon carbide substrate which extend between the drain and gate and between the source and gate, respectively, at the face of the monocrystalline silicon carbide substrate. A third amorphous silicon carbide region may also be provided, adjacent and surrounding the silicon carbide MESFET at the substrate face, to thereby provide a breakdown resistant edge termination region for the transistor.

Two preferred embodiments of silicon carbide MESFETs according to the present invention may be provided. In a first embodiment, the MESFET is fabricated in an epitaxial silicon carbide layer. In a second embodiment, the MESFET is fabricated in an ion implanted silicon carbide layer. Both embodiments can be fabricated using only three masks, with the amorphous silicon carbide regions being self-aligned to the MESFET. A lateral silicon carbide MESFET may thereby be fabricated with very low specific on-resistance and high breakdown voltage.

The first embodiment of a lateral high voltage silicon carbide MESFET includes a monocrystalline silicon carbide substrate having a first monocrystalline silicon carbide region of first conductivity type, and an epitaxially grown second monocrystalline silicon carbide region of second conductivity type on the first monocrystalline silicon carbide region. Spaced apart source and drain regions are formed in the second monocrystalline silicon carbide region, extending to a face thereof opposite the first monocrystalline silicon carbide region. A metal gate is formed directly on the face, between the spaced apart source and drain regions. A first amorphous silicon carbide region is formed in the second monocrystalline silicon carbide region at the face, and extending between the drain and gate. A second amorphous silicon carbide region is formed in the second monocrystalline silicon carbide region, at the face, and extending between the source and the gate. Finally, a third amorphous silicon carbide region is formed in the second monocrystalline silicon carbide region, surrounding the MESFET and extending from the face, through the second monocrystalline silicon carbide region and into the first monocrystalline silicon carbide region. The third amorphous silicon carbide region is thus relatively thick compared to the first and second amorphous silicon carbide regions and forms a breakdown resistant termination region around the MESFET.

The first and second amorphous silicon carbide regions are preferably formed by performing a shallow ion implantation of electrically inactive ions such as argon, using the source and drain electrodes and the metal gate as a mask. The third amorphous silicon carbide region is preferably formed by implanting electrically inactive ions into the face of the substrate. The third amorphous region is most preferably formed by masking the MESFET and performing deep implants of argon or other electrically inactive ions.

The second embodiment of the lateral high voltage, silicon carbide MESFET includes a monocrystalline silicon carbide substrate having a first monocrystalline silicon carbide region of first conductivity type and a second monocrystalline silicon carbide region of second conductivity type in the first monocrystalline silicon carbide region, at a face thereof. Thus, the second monocrystalline silicon carbide region defines a junction with the first monocrystalline silicon carbide region. The junction extends to the substrate face. Preferably, the second monocrystalline silicon carbide region is formed by a masked implant of ions of second conductivity type into the first region. Spaced apart source and drain regions are formed in the second monocrystalline silicon carbide region extending to the face and a metal gate electrode is formed directly on the face between the spaced apart source and drain regions.

Then, first, second and third amorphous silicon regions are formed in the face. The first amorphous silicon carbide region extends between the drain and the metal gate. The second amorphous silicon carbide region extends between the source and the metal gate. The third amorphous silicon carbide region surrounds the MESFET and extends from the second monocrystalline silicon carbide region across the junctions with the first silicon carbide region at the face, and to the first silicon carbide region at the face. The first, second and third amorphous silicon carbide regions are preferably formed simultaneously by performing a shallow implant of an electrically inactive ion such as argon using the source, gate and drain electrodes as masks. Low resistivity and high breakdown lateral silicon carbide MESFETs are thereby formed.

BRIEF DESCRIPTION OF THE DRAWINGS

FIG. 1 is a cross-sectional side view of a first embodiment of a silicon carbide MESFET according to the present invention.

FIG. 2 is a cross-sectional side view of a second embodiment of a silicon carbide MESFET according to the present invention.

FIGS. 3A–3D are cross-sectional side views of the device of FIG. 1 during intermediate fabrication steps.

FIGS. 4A–4D are cross-sectional side views of the device of FIG. 2 during intermediate fabrication steps.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a cross-sectional side view of a first embodiment of a silicon carbide MESFET according to the present invention will be described. As shown in FIG. 1, MESFET 10 includes a monocrystalline silicon carbide substrate 11 having a first monocrystalline silicon carbide region 21 of first conductivity type, here P-type. As also known to those having skill in the art, first monocrystalline silicon carbide region 21 may include a first portion 21b which is highly doped (designated P+) relative to second portion 21a (designated P−). Monocrystalline silicon carbide substrate 11 also includes a second monocrystalline silicon carbide region 12 of second conductivity type, here N-type, formed on the second portion of 21b of first monocrystalline silicon carbide region 21 opposite first portion 21b. As will be described below, second region 12 is preferably an epitaxial layer which is blanket deposited on portion 21a. Second region 12 is also commonly referred to as the "drift region".

Still referring to FIG. 1, a source region 13 and a spaced apart drain region 14 are formed in layer 12 by ion implantation or other well known techniques. A source electrode 15, a drain electrode 17 and a metal gate 16 are formed on face 19, with the metal gate 16 being between the source electrode 15 and drain electrode 16. As shown, metal gate 16 is formed directly on face 19 to form a MESFET. Since the source, drain and gate are all formed on common face 19 a lateral MESFET is provided. A bottom electrode 18 is also provided on portion 21b, opposite portion 21a.

Layer 12 is preferably doped to obtain a reduced surface field (RESURF) effect. The RESURF effect is described in a publication entitled *High Voltage Thin Layer Devices (RESURF Devices)* by Appels et al., IEDM 1979, pp. 238–241, 1979. The criteria for obtaining the RESURF effect is based upon a dopant charge (i.e. the product of dopant concentration and thickness) in layer 12 which is equal to the product of the dielectric constant of the monocrystalline silicon carbide material and the breakdown electric field strength of the device. This dopant charge has a value of about $1 \times 10^{12}/cm^2$ for silicon based upon a breakdown electric field strength of $1.5 \times 10^5$ V/cm.

In contrast, the breakdown electric field strength for silicon carbide is about $3 \times 10^6$ V/cm which results in a dopant charge in layer 12 of $1.6 \times 10^{13}/cm^2$ of N-type dopant. This makes the resistance of the drift region in the lateral device much lower than for silicon. This resistance also depends on the distance between the gate and drain, indicated as $L_D$ in FIG. 1, which is required between the gate and drain to support the voltage. If the electric field along the face 19 is assumed to be constant for RESURF devices, the length $L_D$ is the ratio of the breakdown voltage to the breakdown electric field strength. Thus, $L_D$ for a silicon carbide device 10 is about 20 times smaller than for a comparable silicon device. This reduces the cell pitch and improves specific on resistance.

For a lateral FET, the ideal specific on resistance is the product of a drift layer resistance and the top surface area. It can be shown that this resistance is given by:

$$R_{Dsp} = \frac{L_D^2}{q\mu(N_D \cdot t)} \quad (1)$$

where $R_{Dsp}$ is the on resistance $L_D$ is the distance between the gate and drain q is the electron charge, $1.6\times10^{-19}$ C $\mu$ is the electron mobility $N_D$ is the doping concentration in layer 12 t is the thickness of layer 12

Using the relationship between the dopant charge ($N_D \cdot t$) and the breakdown electric field ($E_c$) and between the drift length ($L_D$) and the breakdown electric field, it can be shown that:

$$R_{Dsp} = \frac{BV^2}{\epsilon \mu E_c^3} \quad (2)$$

where $\epsilon$ is the dielectric constant for silicon carbide.

Using the material parameters for 6H-SiC, the specific resistance for a lateral FET made from silicon carbide is found to be about 1500 times smaller than for a silicon device. Unlike a vertical device where the N-drift layer doping (and hence the mobility) changes with breakdown voltage, in the lateral high voltage device the breakdown voltage can be increased by increasing the drift layer length ($L_D$) without changing the doping (and hence the mobility). Thus, the lateral silicon carbide MESFET 10 can produce very low on-resistance for a wide range of breakdown voltages.

In the RESURF doping described above, breakdown voltage is increased compared to a conventional device. However, the surface electric field still exhibits peaks adjacent facing surfaces of the gate and drain electrodes. According to the present invention, these peaks are reduced or eliminated, and the breakdown voltage is further increased, by providing an electric field equalizing region in the silicon carbide substrate at face 19 which extends between the drain electrode 17 and the metal gate 16. As shown in FIG. 1, a first amorphous silicon carbide region 23 is formed in the second monocrystalline silicon carbide region at the face 19 and extending between the drain electrode 17 and the metal gate 16. As will be described below, first amorphous region 23 is preferably formed by implanting electrically inactive ions such as argon into face 19. This high resistivity region promotes the formation of a uniform electric field along the face, to obtain a high breakdown voltage.

As also shown in FIG. 1, a second electric field equalizing region in the form of a second amorphous silicon carbide region 24 is formed between the source electrode 15 and metal gate 16. Finally, a third amorphous silicon carbide region 25 is formed adjacent and surrounding the MESFET to isolate the MESFET from adjacent devices and to provide breakdown resistant device termination. The third region is a breakdown resistant termination region as described in copending application Ser. No. 08/238,228 entitled *Voltage Breakdown Resistant Monocrystalline Silicon Carbide Semiconductor Devices*, and *Methods of Fabricating Same*, filed concurrently herewith (Attorney Docket No. 5051-253), the disclosure of which is hereby incorporated herein by reference. As shown in FIG. 1, third amorphous silicon carbide region 25 surrounds the MESFET and extends from face 19, through the second monocrystalline silicon carbide region 12 and into the first monocrystalline silicon carbide layer 21a.

FIG. 2 illustrates a second embodiment of a silicon carbide high voltage lateral MESFET 20. MESFET 20 differs from MESFET 10 of FIG. 1 because epitaxial second region 12 is replaced by a patterned second region 12' of second conductivity type. As will be described below, second region 12' is preferably formed by masked ion implantation of second conductivity (here N-type) dopants. Thus, as shown in FIG. 2, N-type second region 12' forms a horizontal junction 26a and a vertical junction 26b with first region 21. The vertical junction 26b extends to face 19. Because the junction extends to face 19, the deep implant third amorphous region 25 (FIG. 1) may be replaced by a shallow implant third amorphous region 25' (FIG. 2) which extends from the second monocrystalline silicon carbide region 12' across the junction 26b and to the first monocrystalline silicon carbide region 21 at face 19. Thus, in the MESFET 20 of FIG. 2, all three amorphous silicon carbide regions 23, 24, and 25' may be formed by a single shallow implant using source electrode 15, gate 16 and drain electrode 17 as a mask.

It will be understood by those having skill in the art that FIG. 1 is shown as a single device embodiment, whereas FIG. 2 is shown as a unit cell wherein many devices are connected in parallel. In the unit cell embodiment, the MESFET is typically replicated in two dimensions across the substrate Thus, the region 25' to the right of drain electrode 17 is not illustrated in FIG. 2 because it would be part of the adjacent unit cell. It will also be understood that the structure of FIG. 1 may be formed in unit cell configuration and the structure of FIG. 2 may be formed as a single device.

Referring now to FIGS. 3A–3D, a method for forming a lateral high voltage silicon carbide MESFET 10 of FIG. 1 will now be described. As will be described, only three masks are necessary to form a self-aligned lateral silicon carbide MESFET. As shown in FIG. 3A, the starting material is either a P– silicon carbide second portion (substrate) 21a or a P– silicon carbide epitaxial second portion 21a grown on a P+ silicon carbide first portion (substrate) 21b. A thin N-type second region 12 is epitaxially grown on P– second portion 21a with a dopant charge of about $10^{13}/cm^2$, i.e. a product of doping concentration and thickness of about $10^{13}/cm^2$. A mask 36 is formed on face 19 and an implant of nitrogen or other N-type conductivity ions 31 is performed. The nitrogen implant is followed by an anneal to form the highly doped N+ source and drain regions 13 and 14 respectively.

Referring now to FIG. 3B, a titanium layer is blanket deposited and then patterned using a second mask (not shown) to form source electrode 15, metal gate 16 and drain electrode 17. If the surface concentration of the N+ regions 13 and 14 is $2\times10^{20}$ per $cm^3$, a specific contact resistance of less than $2\times10^{-5}$ ohm-$cm^2$ can be obtained by using titanium as the contact metal. See the publication by Alok et al. entitled *Low Contact Resistivity Ohmic Contacts to 6H-Sili-* con Carbide, *IEDM Technical Digest*, pp. 691–694, 1993. Thus, it is possible to use a single self-aligned titanium pattern to form all three of the device electrodes because the titanium layer will form a Schottky (rectifying) contact under the gate and ohmic contacts at the source and drain.

Referring now to FIG. 3C, a mask 37 is applied and a deep implantation of argon 32 or other electrically inactive impurity is applied through the second region 12 and extending into first region 21. In other words, the deep implantation of argon extends through the N-P junction. The mask 37 is then removed.

Finally, referring to FIG. 3D, a blanket (unmasked) shallow argon ion implantation 33 is then performed to form a first amorphous region 23 of high resistivity between drain 14 and metal gate 16 and a second amorphous region 24 of high resistivity between source 13 and metal gate 17. The implant energy of argon ions 33 is chosen so that they do not penetrate the titanium metal. For example, argon atoms are implanted at an energy of 30 keV and a dose of at least $10^{15}$cm$^2$ to thereby amorphize the face. Thus, the implant is self-aligned to the source, drain and gate. Amorphous silicon carbide regions 23 and 24 promote the formation, of a uniform electric field along the surface to obtain a high breakdown voltage. They reduce or eliminate, any peaks caused by the RESURF effect.

Implantation of electrically inactive ions into a silicon carbide substrate to create an amorphous region therein is described in U.S. Pat. No. 5,270,244 to the present inventor, the disclosure of which is hereby incorporated herein by reference. Multiple implants at different energies may also be used in order to obtain an amorphous region having the desired depths. Carbon, helium, silicon, hydrogen, neon and other ions may be used. The implant or implants are not followed by an annealing step, so that the amorphized region remains amorphous.

Referring now to FIGS. 4A–4D, a method for forming the lateral high voltage, silicon carbide MESFET 20 of FIG. 2 is illustrated. As in FIGS. 3A–3D, only three masks are required to form a self-aligned lateral silicon carbide MESFET. In FIG. 4A, the starting material is either a P– silicon carbide second portion (substrate) or a P– silicon carbide second portion which is epitaxially grown on a P+ silicon carbide first portion (substrate). Referring to FIG. 4A, an N-type second region 12' is formed by ion implantation of nitrogen 34 with a dose of about $1\times10^{13}$/cm$^2$ using mask 38. Then, referring to FIG. 4B, a masked nitrogen implant 31 is performed at a high dose through mask 36 to form the N+ source and drain regions 13 and 14 as was described above in connection with FIG. 3A. Titanium is then deposited and patterned in FIG. 4C as was already described in connection with FIG. 3B, using a third mask (not shown). Then referring to FIG. 4D, a shallow ion implant of argon 33 or other electrically inactive ion is performed to obtain a high resistivity layer on the top surface. Implant 33 forms regions 23, 24 and 25'. As described above, the energy for this implant is chosen so that it is masked by the metal. This implant produces a self-aligned high resistivity layer which promotes a uniform electric field distribution between the gate and drain and between the source and gate to obtain a high breakdown voltage. The high resistivity layer formed across the N-P junction 26b also provides an edge termination for high breakdown voltage.

The high charge in the second (RESURF) region 12, 12' for the silicon carbide MESFET results in a large pinch-off voltage of about 150 volts. A smaller pinch-off voltage can be obtained by reducing the charge under the metal gate 16. This can be done, for example, by removal of some of the second region under the gate 16 by etching. Alternatively, a lower charge can be used throughout the second region, but this will increase the on-resistance of the second region 12. This problem can also be overcome by using another masked nitrogen implant placed in the drift region, between the gate and drain, to increase the doping in the drift region to the optimum RESURF value resulting in the lowest possible drift region resistance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a silicon carbide field effect transistor, comprising the steps of:

forming spaced apart source and drain regions in a fact of a monocrystalline silicon carbide substrate, and a gate on said face between said spaced apart source and drain regions; and amorphizing said monocrystalline silicon carbide substrate, at said face, between said drain and said gate.

2. A method according to claim 1 wherein said amorphizing step further comprises the step of amorphizing said monocrystalline silicon carbide substrate, at said face, between said source and said gate.

3. A method according to claim 2 wherein said amorphizing step further comprises the step of amorphizing said monocrystalline silicon carbide substrate, at said face, adjacent and surrounding said source and drain regions and said gate.

4. A method according to claim 1 wherein said amorphizing step comprises the step of implanting electrically inactive ions into said face, between said drain and said gate.

5. A method according to claim 3 wherein said amorphizing step comprises the step of implanting electrically inactive ions into said face, between said drain and said gate, between said source and said gate, and adjacent and surrounding said source and drain regions and said gate.

6. A method according to claim 5 wherein said implanting electrically inactive ions step comprises the step of implanting argon ions.

7. A method according to claim 1 wherein said gate forming step comprises the step of forming a metal gate directly on said face, to provide a MESFET.

8. A method according to claim 1 wherein said forming step further comprises the step of:

forming a source electrode on said face electrically contacting said source region, and a drain electrode on said face electrically contacting said drain region, said source electrode, said drain electrode and said gate all comprising titanium, such that said source electrode and said drain electrode form ohmic contacts with said source region and said drain region, respectively, and said metal gate forms a rectifying contact with said face.

9. A method according to claim 1 wherein comprises the steps of:

forming a blanket titanium layer on said face; and patterning said blanket titanium layer to define a source electrode on said face, electrically contacting said source region, a drain electrode on said face, electrically contacting said drain region, and said gate.

10. A method according to claim 1 wherein said forming step is preceded by the step of doping said monocrystalline silicon carbide substrate at a predetermined dopant charge at said face, said predetermined dopant charge being equal to the product of the dielectric constant of said monocrystalline silicon carbide substrate and the breakdown electric field strength of silicon carbide.

11. A method of forming a silicon carbide MESFET comprising the steps of:

epitaxially forming a second monocrystalline silicon carbide region of second conductivity type on a first monocrystalline silicon carbide region of first conductivity type, said second monocrystalline silicon carbide region having a face opposite said first monocrystalline silicon carbide region;

forming spaced apart source and drain regions in said second monocrystalline silicon carbide region, extending to said face;

forming source and drain electrodes on said face, electrically contacting said source and drain regions respectively, and a metal gate directly on said face between said spaced apart source and drain regions; and amorphizing said face between said source electrode and said metal gate, between said drain electrode and said metal gate, and adjacent and surrounding said MESFET extending from said face, through said second monocrystalline silicon carbide region and into first monocrystalline silicon carbide region.

12. A method according to claim 11 wherein said epitaxially forming step comprises the steps of:

epitaxially forming a first monocrystalline silicon carbide portion of said first conductivity type on a monocrystalline silicon carbide substrate of said first conductivity type, said substrate being more highly doped than said first portion; and epitaxially forming said second monocrystalline silicon carbide region on said first monocrystalline silicon carbide portion, opposite said substrate.

13. A method according to claim 11 wherein said amorphizing step comprises the step of implanting electrically inactive ions into said face between said source electrode and said metal gate, between said drain electrode and said metal gate, and adjacent and surrounding said MESFET extending from said face, through said second monocrystalline silicon carbide region and into first monocrystalline silicon carbide region, at an energy and dose which is sufficient to amorphize said second monocrystalline silicon carbide region, at said face.

14. A method according to claim 13 wherein said implanting step comprises implanting argon ions into said face at an energy of about 30 keV and a dose of at least about $10^{15}/cm^2$.

15. A method according to claim 11 wherein said step of forming source and drain electrodes and a metal gate comprises the steps of:

forming a blanket metal layer on said face: and patterning said blanket layer to define said source and drain electrodes and said metal gate.

16. A method according to claim 15 wherein said amorphizing step comprises the steps of:

masking said MESFET;

performing a deep implant of electrically inactive ions at an energy and a dose which is sufficient to amorphize said second monocrystalline silicon carbide region adjacent and surrounding said MESFET extending from said face, through said second monocrystalline silicon carbide region and into first monocrystalline silicon carbide region; and performing a blanket shallow implant of electrically inactive ions at an energy and a dose which is sufficient to amorphize said face between said source electrode and said metal gate, and between said drain electrode and said metal gate.

17. A method according to claim 15 wherein said blanket metal layer forming step comprises the step of blanket forming a titanium layer, such that the patterned source electrode and drain electrode form ohmic contacts with said source region and said drain region, respectively, and the patterned metal gate forms a rectifying contact with said face.

18. A method according to claim 11 wherein said epitaxially forming step comprises the step of epitaxially forming said second monocrystalline silicon carbide region with a predetermined dopant charge, said predetermined dopant charge being equal to the product of the dielectric constant of said monocrystalline silicon carbide substrate and the breakdown electric field strength of silicon carbide.

19. A method of fabricating a silicon carbide MESFET comprising the steps of:

performing a masked implantation of ions of a second conductivity type into a face of a first monocrystalline silicon carbide region of first conductivity type, to form a second monocrystalline silicon carbide region of second conductivity type in said first monocrystalline silicon carbide region, at a face thereof, said second monocrystalline silicon carbide region defining a junction with said first monocrystalline silicon carbide region, said junction extending adjacent said face;

forming spaced apart source and drain regions in said second monocrystalline silicon carbide region, extending to said face;

forming source and drain electrodes on said face, electrically contacting said source and drain regions respectively, and a metal gate directly on said face between said spaced apart source and drain regions; and amorphizing said face between said source electrode and said metal gate, between said drain electrode and said metal gate, and adjacent and surrounding said MESFET extending from said second monocrystalline silicon carbide region, across said junction and to said first monocrystalline silicon carbide region at said face.

20. A method according to claim 19 wherein said masked implantation performing step comprises the steps of:

epitaxially forming a first monocrystalline silicon carbide portion of said first conductivity type on a monocrystalline silicon carbide substrate of said first conductivity type, said substrate being more highly doped than said first portion; and performing a masked implantation of ions of said second conductivity type into said first monocrystalline silicon carbide region portion, to form said second monocrystalline silicon carbide region of second conductivity type in said first monocrystalline silicon carbide portion, at a face thereof, said second monocrystalline silicon carbide region defining a junction with said first monocrystalline silicon carbide portion, said junction extending adjacent said face.

21. A method according to claim 20 wherein said amorphizing step comprises the step of implanting electrically inactive ions into said face between said source electrode and said metal gate, between said drain electrode and said metal gate, and adjacent and surrounding said MESFET, extending from said second monocrystalline silicon carbide region, across said junction and to said first monocrystalline silicon carbide region at said face, at an energy and dose which is sufficient to amorphize said second monocrystalline silicon carbide region, at said face.

22. A method according to claim 21 wherein said implanting step comprises implanting argon ions into said face at an energy of about 30 keV and a dose of at least about $10^{15}/cm^2$.

23. A method according to claim 19 wherein said source and drain electrode and metal gate forming step comprises the steps of:

forming a blanket metal layer on said face: and patterning said blanket layer to define said source and drain electrodes and said metal gate.

24. A method according to claim 23 wherein said amorphizing step comprises the step of:

performing a blanket shallow implant of electrically inactive ions at an energy and a dose which is sufficient to amorphize said face between said source electrode and said metal gate, between said drain electrode and said metal gate and surrounding said MESFET extending from said second monocrystalline silicon carbide region, across said junction and to said first monocrystalline silicon carbide region at said face.

25. A method according to claim 24 wherein said blanket metal layer forming step comprises the step of blanket forming a titanium layer, such that the patterned source electrode and drain electrode form ohmic contacts with said source region and said drain region, respectively, and the patterned metal gate forms a rectifying contact with said face.

26. A method according to claim 19 wherein said step of performing a masked implantation of ions of a second conductivity type comprises the step of performing a masked implantation of ions of a second conductivity type with ions of a predetermined dopant charge, said predetermined dopant charge being equal to the product of the dielectric constant of said monocrystalline silicon carbide substrate and the breakdown electric field strength of silicon carbide.

* * * * *